(12) United States Patent
Iizuka

(10) Patent No.: US 9,196,461 B2
(45) Date of Patent: Nov. 24, 2015

(54) PLASMA PROCESSING APPARATUS

(75) Inventor: Hachishiro Iizuka, Nirasaki (JP)

(73) Assignee: TOKYO ELECTRON LIMITED (JP)

( * ) Notice: Subject to any disclaimer, the term of this patent is extended or adjusted under 35 U.S.C. 154(b) by 116 days.

(21) Appl. No.: 13/287,484

(22) Filed: Nov. 2, 2011

(65) Prior Publication Data

US 2012/0111501 A1 May 10, 2012

Related U.S. Application Data

(60) Provisional application No. 61/415,208, filed on Nov. 18, 2010.

(30) Foreign Application Priority Data

Nov. 4, 2010 (JP) .................................. 2010-247362

(51) Int. Cl.
  *C23C 16/455* (2006.01)
  *H01J 37/32* (2006.01)

(52) U.S. Cl.
  CPC ........ *H01J 37/3244* (2013.01); *H01J 37/32091* (2013.01); *H01J 37/32568* (2013.01)

(58) Field of Classification Search
  CPC ................... C23C 16/45565; C23C 16/45563; C23C 16/45568; C23C 16/4557; C23C 16/45572; C23C 16/45574; H01J 37/32568; H01J 37/3244; H01J 37/32477; H01J 37/32495; H01J 37/32513; H01J 37/32431; H01J 37/32532; H01J 37/32623
  See application file for complete search history.

(56) References Cited

U.S. PATENT DOCUMENTS

| | | | | |
|---|---|---|---|---|
| 2001/0054484 A1* | 12/2001 | Komino | .................. | 156/345 |
| 2006/0000411 A1* | 1/2006 | Seo et al. | .................. | 118/715 |
| 2009/0194233 A1* | 8/2009 | Tamura et al. | .................. | 156/345.1 |
| 2009/0293809 A1* | 12/2009 | Cho et al. | .................. | 118/725 |
| 2009/0308537 A1* | 12/2009 | Shibuya et al. | .................. | 156/345.35 |
| 2010/0043975 A1* | 2/2010 | Hayashi | .................. | 156/345.33 |
| 2010/0243166 A1* | 9/2010 | Hayashi | .................. | 156/345.34 |
| 2010/0243167 A1* | 9/2010 | Hayashi | .................. | 156/345.43 |

FOREIGN PATENT DOCUMENTS

| | | | |
|---|---|---|---|
| JP | 55006409 A | * | 1/1980 |
| JP | 59089759 A | * | 5/1984 |
| JP | 60114577 | | 6/1985 |
| JP | 07211647 | | 8/1995 |

(Continued)

*Primary Examiner* — Gordon R Baldwin
*Assistant Examiner* — Yuechuan Yu
(74) *Attorney, Agent, or Firm* — Cantor Colburn LLP

(57) ABSTRACT

A plasma processing apparatus includes: a lower electrode which is provided in a process chamber and functions as a holding stage on which a substrate is placed; an upper electrode which functions as the shower head for introducing a gas and is vertically movable; a cover body which is provided over the upper electrode and hermetically closes an upper opening of the process chamber; an isolated space providing member which is provided to close a space between the upper electrode and the cover body, provides therein an isolated space isolated from a space outside the isolated space providing member, and includes therein an inlet/outlet through which a gas is introduced/exhausted, wherein a size of the isolated space varies as the upper electrode is vertically moved; and a gas introducing and exhausting mechanism which introduces/exhausts a gas into/from the isolated space of the isolated space providing member.

9 Claims, 8 Drawing Sheets

(56) References Cited

FOREIGN PATENT DOCUMENTS

| JP | 10302998 | 11/1998 |
| JP | 2000-100789 | 4/2000 |
| JP | 2003181756 A | * 7/2003 |
| JP | 2003303795 A | * 10/2003 |
| JP | 2004360028 A | * 12/2004 |
| JP | 2005093843 A | * 4/2005 |
| JP | 2010238961 | 10/2010 |

* cited by examiner

PLASMA PROCESSING APPARATUS

CROSS-REFERENCE TO RELATED PATENT APPLICATIONS

This application claims the benefits of Japanese Patent Application No. 2010-247362, filed on Nov. 4, 2011 in the Japan Patent Office, and the U.S. patent application No. 61/415,208, filed on Nov. 18, 2010 in the U.S. Patent and Trademark Office, the disclosures of which are incorporated herein in its entirety by reference.

BACKGROUND OF THE INVENTION

1. Field of the Invention

The present invention relates to a plasma processing apparatus.

2. Description of the Related Art

A shower head for introducing a gas in a shower shape to a substrate such as a semiconductor wafer has been used to manufacture a semiconductor device or the like. That is, in a plasma processing apparatus for performing plasma etching on a substrate such as a semiconductor wafer, a holding stage on which the substrate is placed is provided in a process chamber and a shower head is provided to face the holding stage. A plurality of gas ejecting holes are provided in a surface of the shower head facing the holding stage and a gas is introduced in a shower shape to the substrate through the gas ejecting holes.

To achieve uniform gas flow in the process chamber, the plasma processing apparatus is configured to exhaust a gas downward around the holding stage. Also, the plasma processing apparatus is configured to change an interval between the shower head, which functions as an upper electrode, and the holding stage, which functions as a lower electrode (as disclosed in, for example, Patent Reference 1).

When the plasma processing apparatus is configured to change the interval between the shower head, which functions as an upper electrode, and the holding stage, which functions as a lower electrode, by vertically moving the shower head, a space (referred to as a rear side space) whose size changes as a size change of a process space needs to be provided at a side opposite to (referred to as a rear side) the process space with the shower head between the rear side surface and the process space. However, the rear side space may adversely affect plasma processing.

That is, abnormal discharge may occur in the rear side space, and the state of plasma in the process space may be changed due to the abnormal discharge or contamination may be caused due to the abnormal discharge. Also, when a process gas is introduced into the rear side space, plasma density or ion concentration in the process space may be reduced or deposits may be attached to a wall surface of the rear side space. Such problems occur not only during etching but also during film formation.

3. Prior Art Reference (Patent Reference 1) Japanese Patent Laid-Open Publication No. 2000-100789

SUMMARY OF THE INVENTION

The present invention provides a plasma processing apparatus which is configured to change an interval between a shower head and a lower electrode by vertically moving the shower head, so as to prevent a phenomenon such as abnormal discharge which may adversely affect plasma processing from occurring in a rear side space of the shower head and so as to stably perform excellent plasma processing.

According to an aspect of the present invention, there is provided a plasma processing apparatus including: a process chamber in which a substrate is received and plasma processing is performed; a lower electrode which is provided in the process chamber and functions as a holding stage on which the substrate is placed; an upper electrode which is provided in the process chamber to face the lower electrode, provides a process space between the upper electrode and the lower electrode, functions as a shower head for introducing a process gas to the substrate through a plurality of gas ejecting holes provided in a surface of the upper electrode facing the lower electrode, and is vertically movable to change an interval between the upper electrode and the lower electrode; a cover body which is provided over the upper electrode and hermetically closes an upper opening of the process chamber; an isolated space providing member which is provided to close a space between the upper electrode and the cover body, provides therein an isolated space isolated from a space outside the isolated space providing member, and includes an inlet/outlet through which a gas is introduced and exhausted, wherein a size of the isolated space varies as the upper electrode is vertically moved; a gas introducing and exhausting mechanism which introduces/exhausts the gas through the inlet/outlet into/from the isolated space of the isolated space providing member; and a high frequency power supply which generates plasma from the process gas by supplying high frequency power between the upper electrode and the lower electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
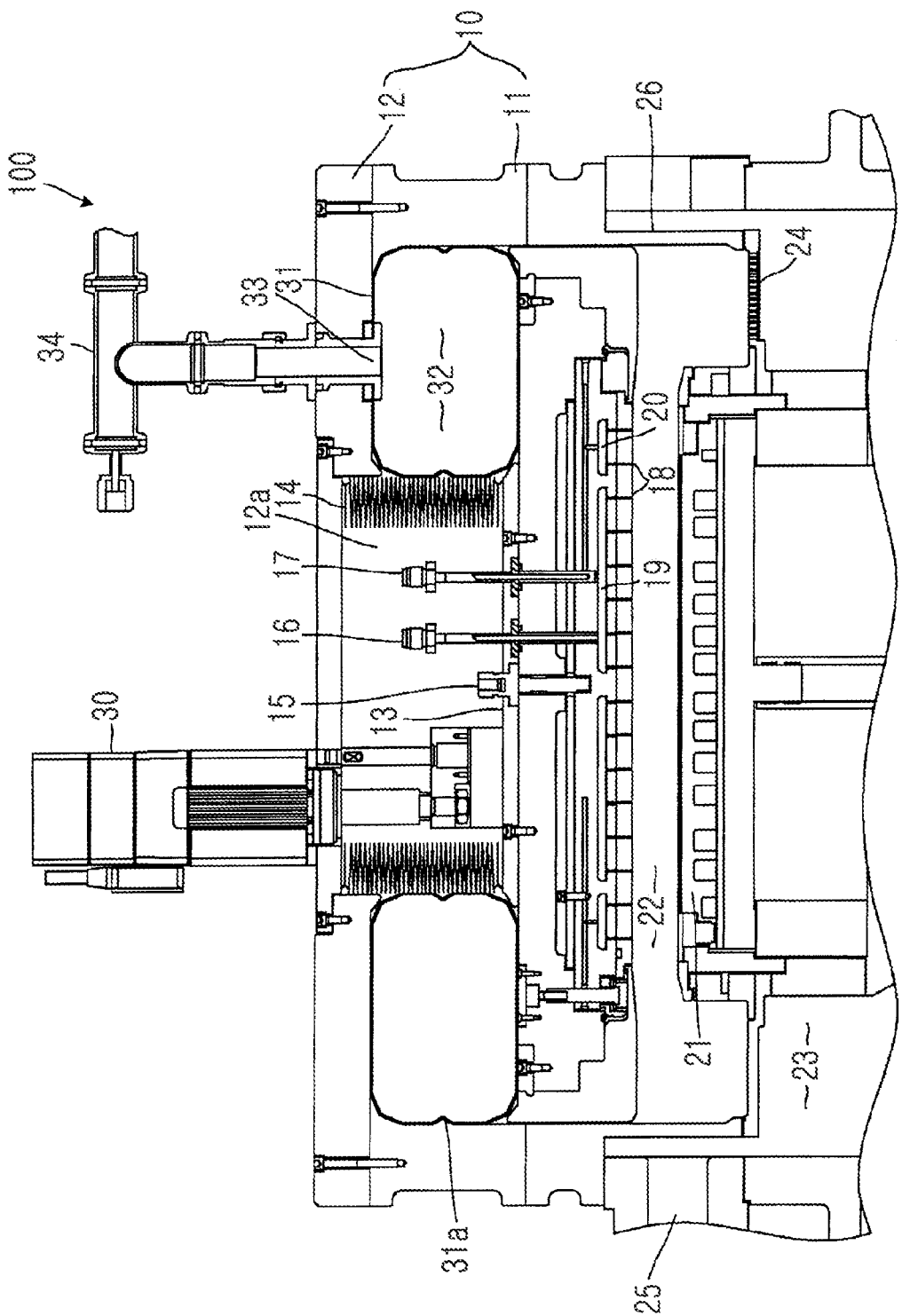
FIG. 1 is a longitudinal-sectional view showing a structure of a plasma processing apparatus according to an embodiment of the present invention.
Figure 2:
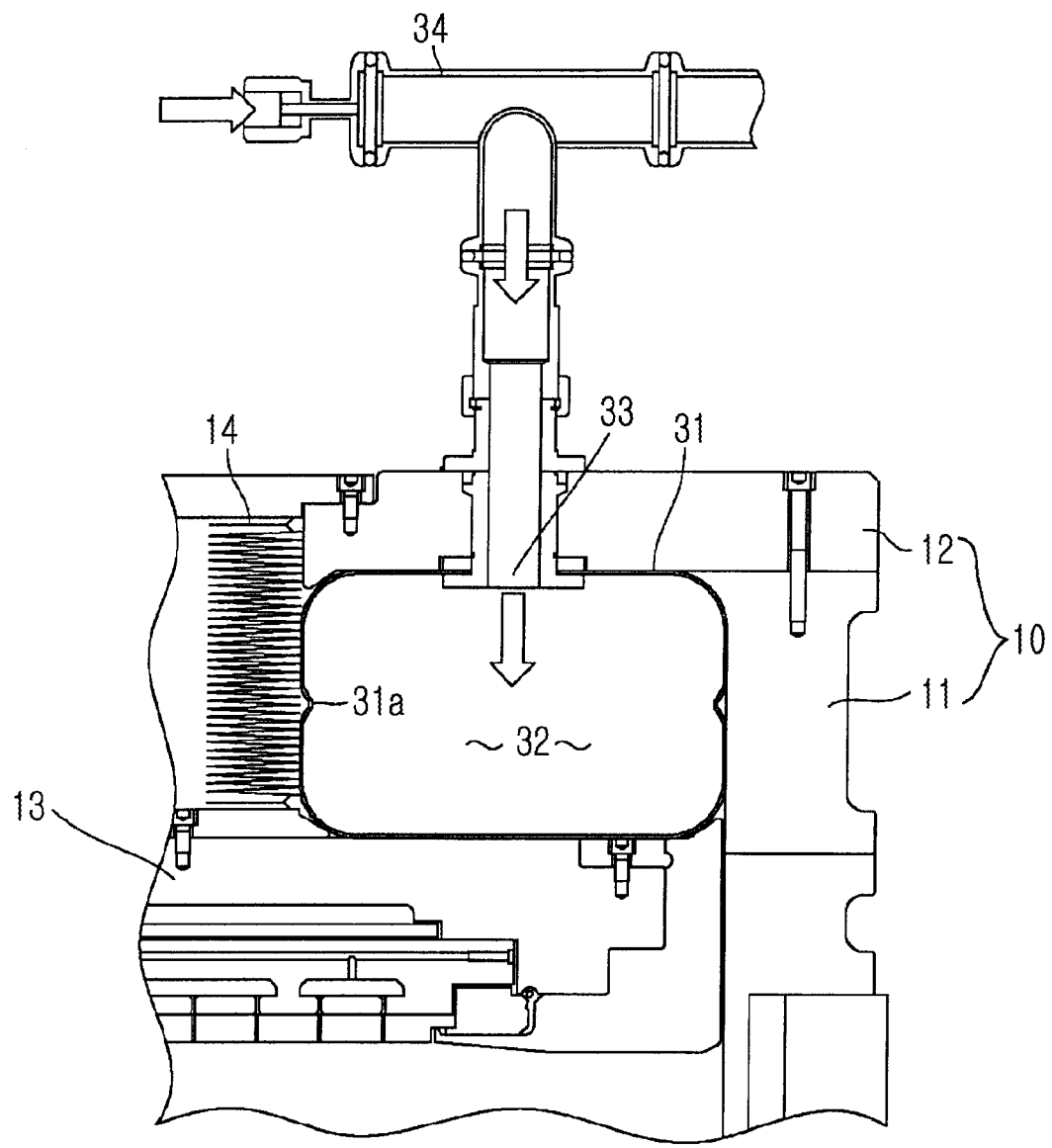
FIG. 2 is an enlarged longitudinal-sectional view showing essential parts of the plasma processing apparatus of FIG. 1.

FIG. 1 is a longitudinal-sectional view schematically showing a structure of a plasma etching apparatus 100 which is a plasma processing apparatus according to an embodiment of the present invention. FIG. 2 is an enlarged longitudinal-sectional view showing essential parts of the plasma etching apparatus 100 of FIG. 1. The plasma etching apparatus 100 of the present embodiment is a capacity-coupled parallel plate plasma etching apparatus essentially including electrode plates which face each other to be vertically parallel to each other and a power supply for generating plasma (not shown) which is connected to the electrode plates.

The plasma etching apparatus 100 includes a process chamber 10 which has a cylindrical shape and receives therein a substrate to be processed. The process chamber 10 essentially includes a process chamber body 11 which has a cylindrical shape and has an upper opening, and a cover body 12 which hermetically closes the upper opening of the process chamber body 11. Each of the process chamber body 11 and the cover body 12 is formed of, for example, aluminium of which a surface is anodized.

The cover body 12 has an annular shape and an opening 12a having a circular shape provided at a central portion thereof. Also, a shower head 13 functioning as an upper electrode and having a substantially circular plate shape is provided in the process chamber 10 to be located under the cover body 12. A metal bellows 14 having a cylindrical shape is provided between a peripheral portion of the opening 12a of the cover body 12 and a top surface of the shower head 13 to hermetically close a space between the peripheral portion of the opening 12a and the top surface of the shower head 13.

As described above, since the cover body 12 having the annular shape and having the opening 12a provided at the central portion thereof is used and the metal bellows 14 is provided between the top surface of the shower head 13 and the cover body 12, a surface area of a portion of the shower head 13 exposed to air may be reduced. Accordingly, since an area of a portion to which a pressure corresponding to a difference between a pressure inside the process chamber 10, which is depressurized, and a pressure outside the process chamber 10 (atmospheric pressure) is exerted is reduced, a driving force needed to vertically move the shower head 13 may be reduced.

A multi-axis driving method in which a driving shaft of an elevating actuator 30 for vertically moving the shower head 13 is connected to a portion of the top surface of the shower head 13 which is exposed to air. A motor cylinder is used as the elevating actuator 30 in the present embodiment. A plurality of the elevating actuators 30 are arranged at regular intervals along a circumference of the process chamber 10 is used. As such, since the multi-axis driving method using the motor cylinder is used, an alignment of the shower head 13 may be precisely controlled compared to a case using a driving mechanism using a pneumatic driving method. Also, although the multi-axis driving method is used, cooperative control may be electrically performed easily.

Also, an upper electrode terminal 15 is provided at a substantially central portion of the top surface of the shower head 13, and two gas introducing units, that is, a first gas introducing unit 16 and a second gas introducing unit 17, are provided beside the upper electrode terminal 15. The upper electrode terminal 15 is connected to a high frequency power supply device such as a high frequency power supply, or a ground potential.

A plurality of gas ejecting holes 18 are provided in a bottom surface of the shower head 13. Also, a first gas passage 19 connected to the first gas introducing unit 16, and a second gas passage 20 connected to the second gas introducing unit 17 are provided in the shower head 13. The first gas passage 19 is provided at a central portion of the shower head 13, and a process gas is introduced from the central portion of the shower head 13 through the first gas passage 19. Meanwhile, the second gas passage 20 is provided at a peripheral portion of the shower head 13, and a process gas is introduced from the peripheral portion of the shower head 13 through the second gas passage 20.

A holding stage 21 on which the substrate is placed is provided in the process chamber 10 under the shower head 13 to face the bottom surface of the shower head 13. An electrostatic chuck (not shown) to adsorb the substrate on the holding stage 21 electrostatically and a temperature control medium circulating passage (not shown) for controlling a temperature of the substrate placed on the holding stage 21 to a predetermined temperature are provided on the holding stage 21.

The holding stage 21 functioning as a lower electrode and the shower head 13 functioning as an upper electrode are a pair of counter electrodes. Since the high frequency power supply device (not shown), which may be a high frequency power supply, is connected to the holding stage 21, a space between the holding stage 21 and the shower head 13 is a process space 22 in which plasma for processing the substrate is generated.

Since an exhaust space 23 having an annular shape is provided under the holding stage 21, a gas inside the process chamber 10 is exhausted at a predetermined vacuum level by using an exhauster such as a vacuum pump (not shown) provided below the exhaust space 23. Also, a baffle plate 24 having an annular shape and adapted to separate the process space 22 and the exhaust space 23 is provided around the holding stage 21.

An opening 25 through which the substrate is transferred to/from the process chamber 10 is provided in a side wall of the process chamber 10 on a side of the process space 22. An opening and closing mechanism (not shown) such as a gate valve is provided in the opening 25. Also, a shield ring 26 is provided in the process space 22 of the process chamber 10 to cover an inner wall of the process chamber 10.

As shown in FIG. 2, an isolated space providing member 31 is provided between the cover body 12 and the shower head 13 at a rear side (an upper side in FIGS. 1 and 2) of the shower head 13 to close a space (referred to as a rear side space) between the shower head 13 and the cover body 12. The isolated space providing member 31 has an annular shape conforming to a shape of a space surrounded by the shower head 13, the cover body 12, a side wall of the process chamber body 11, and the metal bellows 14.

Also, in the present embodiment, the isolated space providing member 31 is formed of an elastic material and functions like a balloon, and an isolated space 32 is provided inside the isolated space providing member 31 to be isolated from a space outside the isolated space providing member 31.

Also, as a material of the isolated space providing member 31, resin or the like may be used and particularly an elastomer (for example, silicone rubber or fluorine rubber) having elasticity may be appropriately used. Also, as a material of the isolated space providing member 31, any one of an insulating material and a conductive material may be used.

An inlet/outlet 33 through which a gas is introduced into/exhausted from the isolated space is provided in a top surface of the isolated space providing member 31, and a gas introducing and exhausting mechanism 34 is connected to the inlet/outlet 33. The gas introducing and exhausting mechanism 34 is connected to a gas introducing source (not shown) and an exhauster (not shown).

Since the isolated space providing member 31 is modified as the shower head 13 is vertically moved and the isolated space providing member 31 is always swollen as a gas such as an inert gas is introduced from/exhausted into the gas introducing and exhausting mechanism 34 into/from the isolated space 32, the isolated space providing member 31 fully occupies the space surrounded by the shower head 13, the cover body 12, the side wall of the process chamber body 11, and the metal bellows 14 even though a size of the space surrounded by the shower head 13, the cover body 12, the side wall of the process chamber body 11, and the metal bellows 14 is changed, thereby making it possible for the space surrounded by the shower head 13, the cover body 12, the side wall of the process chamber body 11, and the metal bellows 14 to be closed by the isolated space providing member 31.

Figure 3:
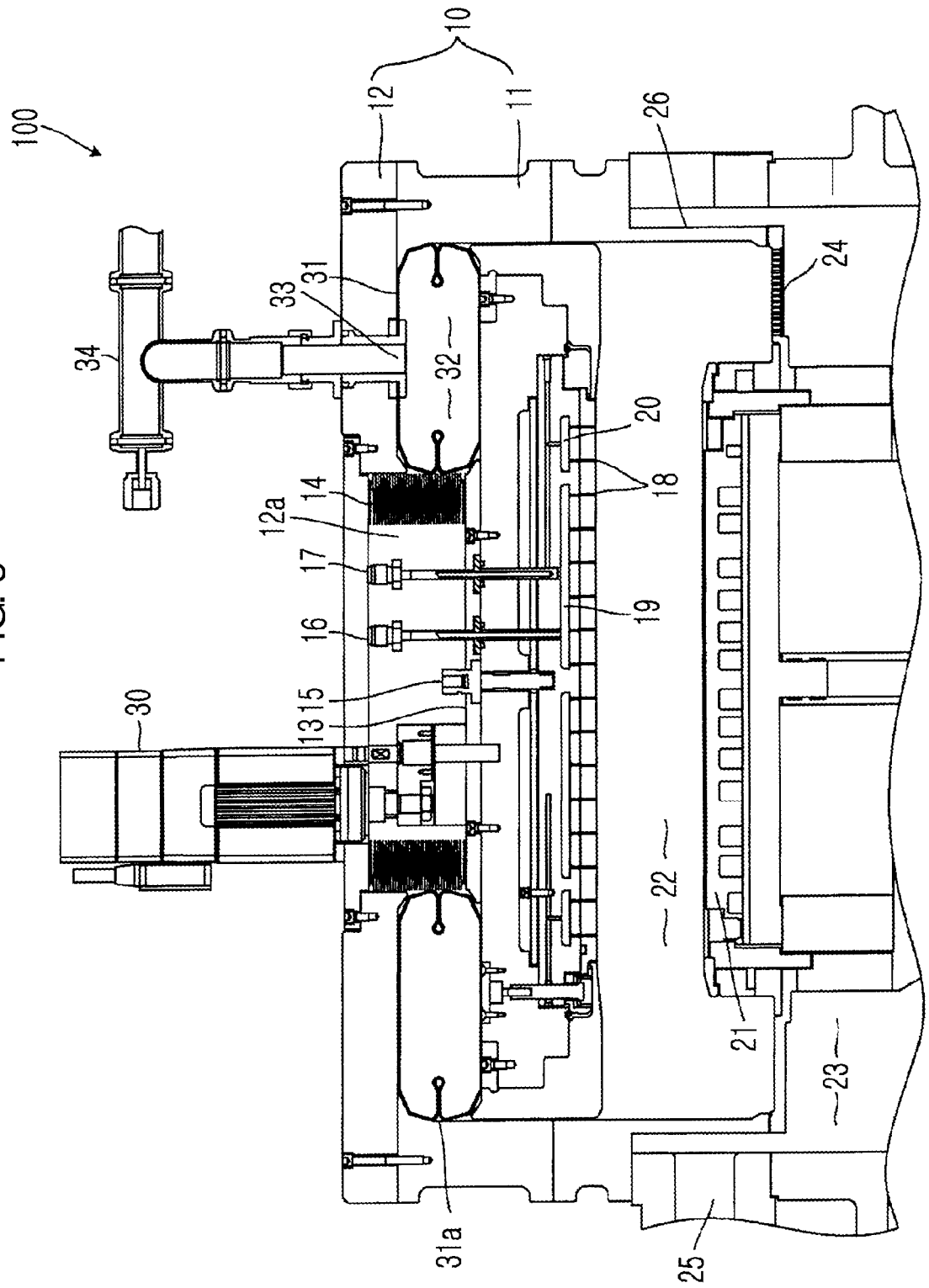
FIG. 3 is a longitudinal-sectional view showing a state where an upper electrode of the plasma processing apparatus of FIG. 1 is raised.
Figure 4:
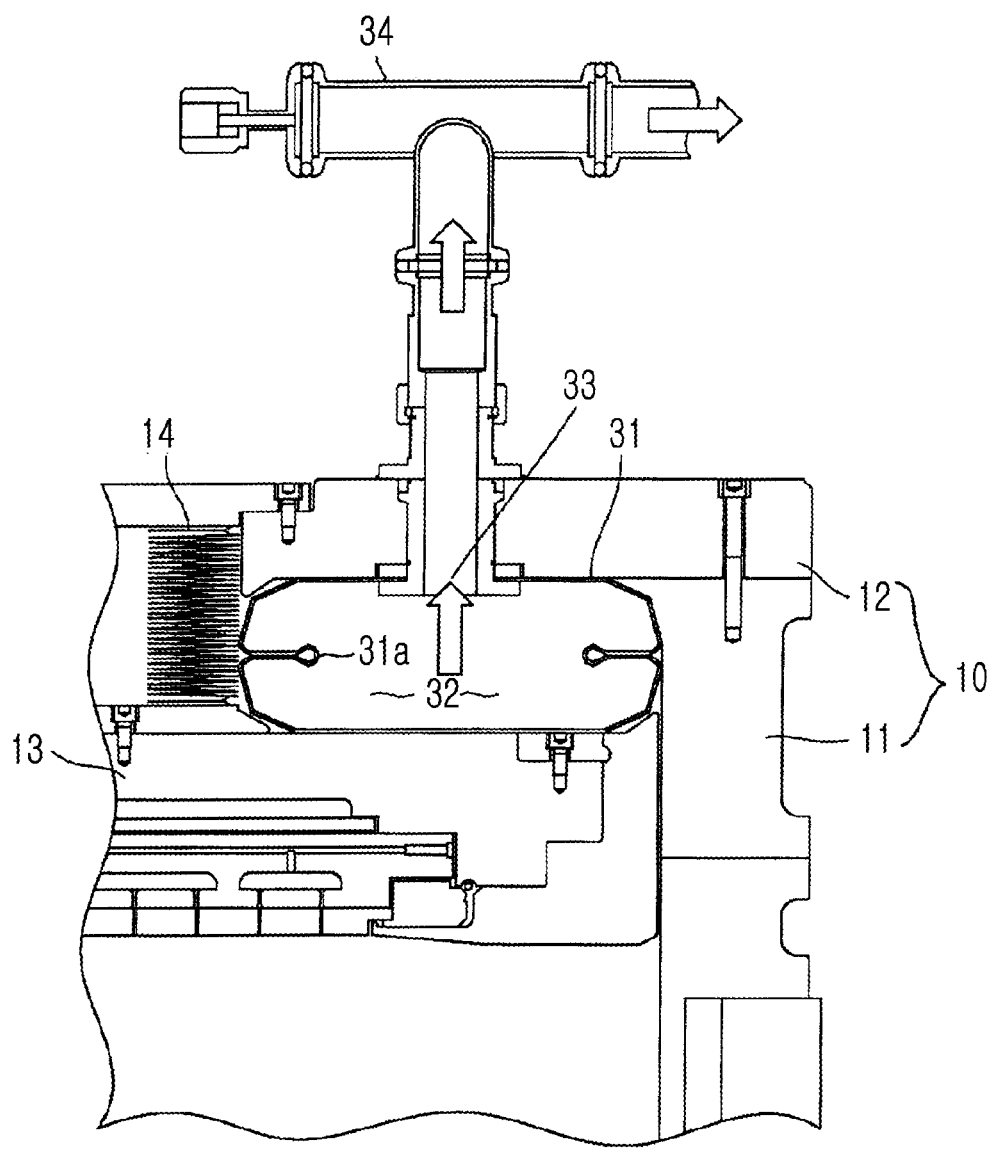
FIG. 4 is an enlarged longitudinal-sectional view showing essential parts of the plasma processing apparatus in the state of FIG. 3.
Figure 5:
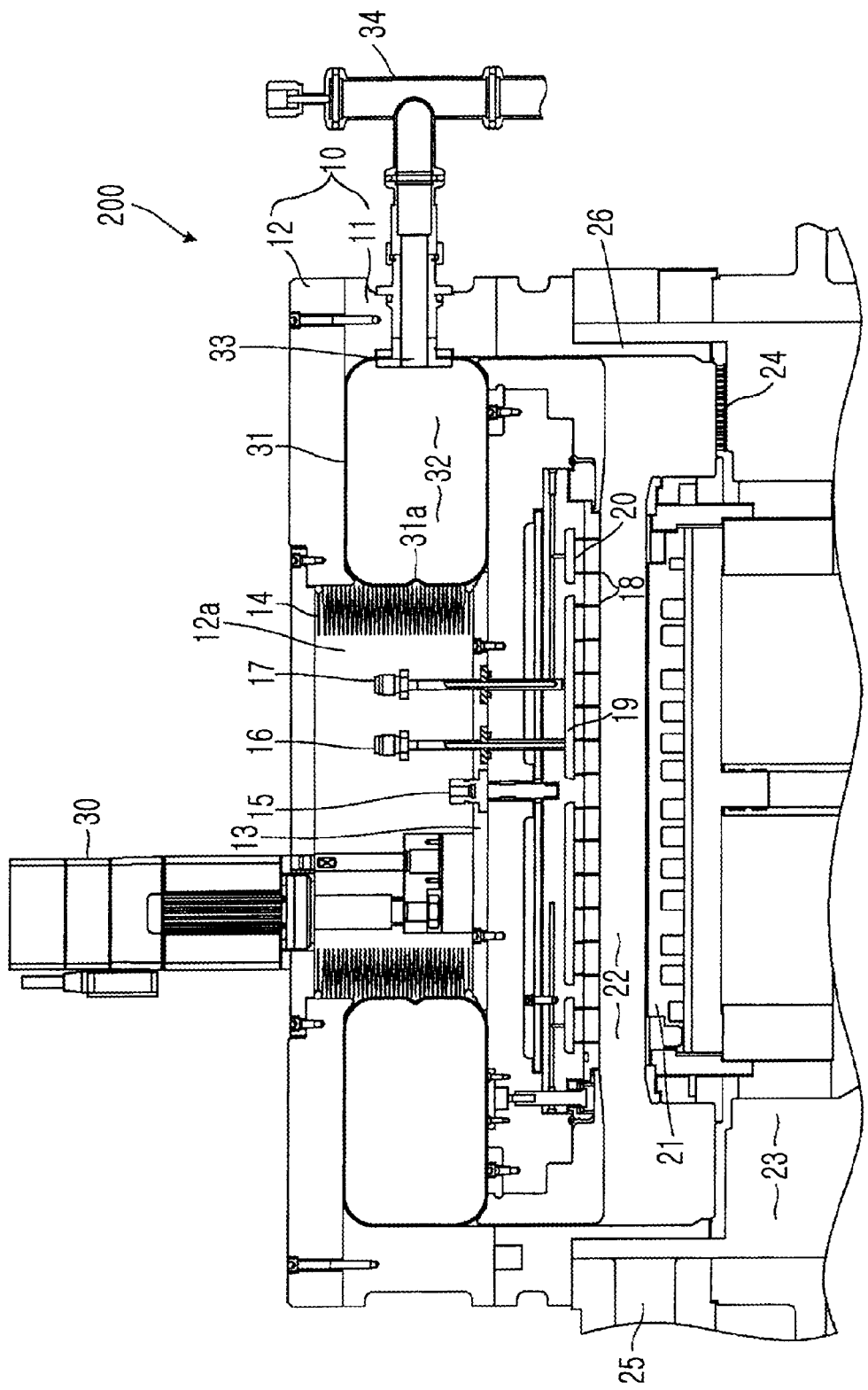
FIG. 5 is a longitudinal-sectional view showing a structure of a plasma processing apparatus according to another embodiment of the present invention.
Figure 6:
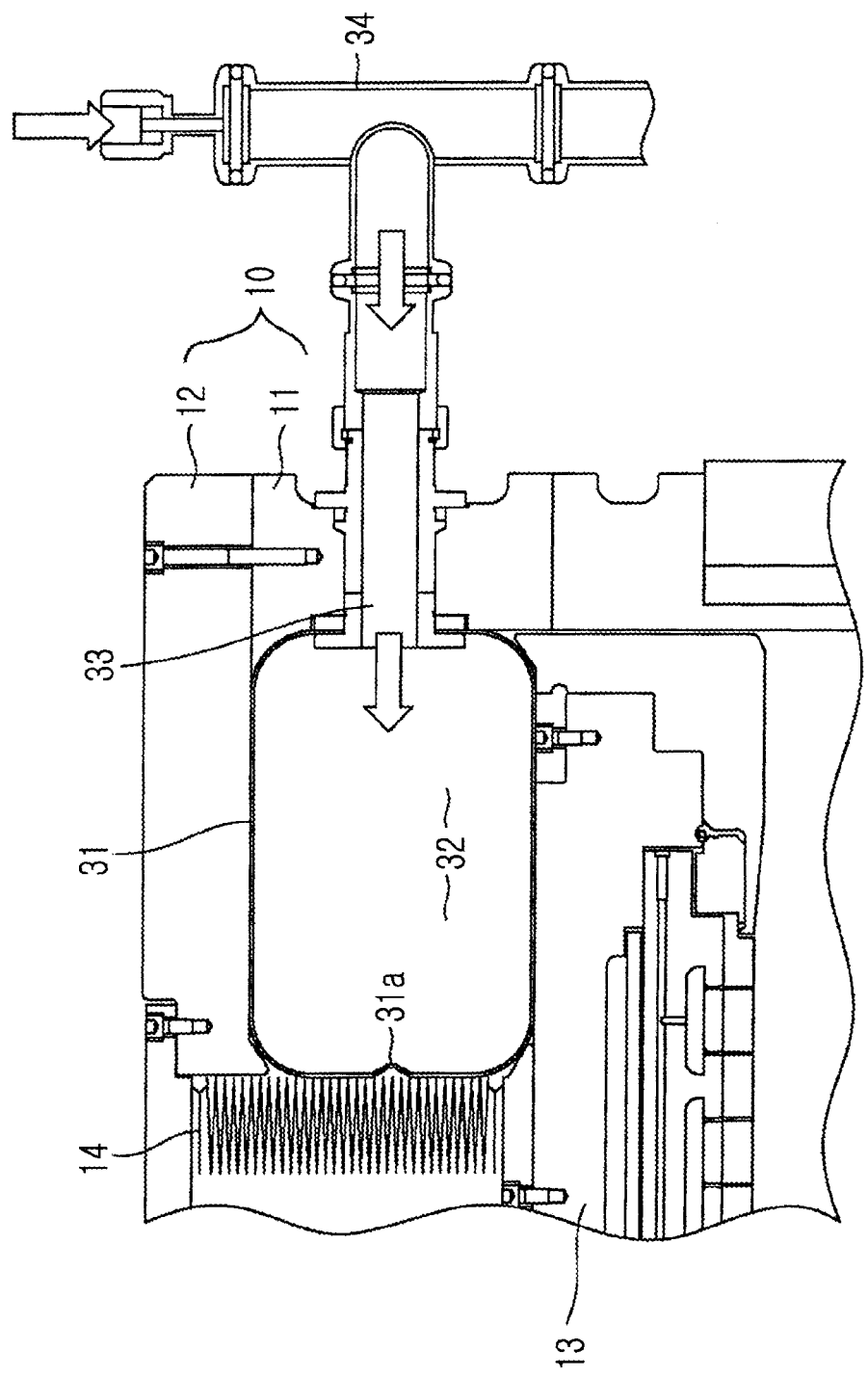
FIG. 6 is an enlarged longitudinal-sectional view showing essential parts of the plasma processing apparatus of FIG. 5.

That is, even when the shower head 13 is vertically moved, since the space surrounded by the shower head 13, the cover body 12, the side wall of the process chamber body 11, and the metal bellows 14 is always closed by the isolated space providing member 31, a large space is not provided outside the isolated space providing member 31. Also, FIGS. 3 and 4 show a state where the shower head 13 is raised to increase the process space 22, as compared to a state of FIGS. 1 and 2. In the state of FIGS. 3 and 4, a folded portion 31a provided at a central portion of the isolated space providing member 31 in a height-wise direction of the isolated space providing member 31 is provided to be folded inward. As such, since the isolated space providing member 31 is folded, a gap is not provided in the rear side space whose size is reduced by raising the shower head 13.

As described above, since the rear side space provided at the rear side of the shower head 13 is closed by the isolated space providing member 31, abnormal discharge may be prevented from occurring in the rear side space during plasma processing. Also, contamination caused due to the abnormal discharge may also be prevented. Also, since a process gas is prevented from being introduced into the rear side space, a reduction in plasma density or ion concentration in the process space 22 and attachment of deposits, which may occur when the process gas is introduced into the rear side space, may be avoided.

Also, if the isolated space providing member 31 is formed of an insulating member, since the isolated space providing member 31 formed of an insulating member is disposed between the shower head 13, the cover body 12, the side wall of the process chamber body 11, and the metal bellows 14, which are formed of conductors, abnormal discharge may be prevented. Also, if the isolated space providing member 31 is formed of a conductive member, since the isolated space providing member 31 formed of a conductive material contacts the shower head 13, the cover body 12, the side wall of the process chamber body 11, and the metal bellows 14, which are formed of conductors, a high potential difference generated between elements may be prevented, thereby preventing abnormal discharge.

When plasma etching is performed on the substrate, which may be a semiconductor wafer, by using the plasma etching apparatus 100 constructed as described above, the opening and closing mechanism (not shown) provided in the opening 25 provided in the side wall of the process chamber 10 is opened, the substrate is transferred into the process chamber 10 through the opening 25 by using a transfer arm or the like of a transfer robot, the substrate is placed on the holding stage 21, and the substrate is adsorbed by using the electrostatic chuck (not shown).

Next, the opening 25 is closed by retracting the transfer arm or the like of the transfer robot from the process chamber 10, and a gas inside the process chamber 10 is exhausted to a predetermined vacuum level by using the exhauster (not shown) in the exhaust space 23. A predetermined flow rate of a predetermined process gas (an etching gas) is introduced into the process chamber 10 from the shower head 13.

After the pressure inside the process chamber 10 is maintained at a predetermined pressure, high frequency power having a predetermined frequency, for example, 13.56 MHz, is supplied to at least one of the holding stage 21 and the shower head 13, for example, only to the holding stage 21. Accordingly, a high frequency electric field is generated between the shower head 13 functioning as an upper electrode and the holding stage 21 functioning as a lower electrode, and thus the etching gas is dissociated to generate plasma. Due to the plasma, predetermined etching is performed on the substrate.

During this etching, since the interval between the shower head 13 and the holding stage 21 is set to an interval suitable for etching by vertically moving the shower head 13, uniform and excellent etching may be performed on the substrate. Also, during this etching, since abnormal discharge is prevented from occurring in the rear side space of the shower head 13, the state of the plasma in the process space 22 may be prevented from being changed due to the abnormal discharge. Also, since deposits are prevented from being generated in the rear side space, the deposits may be prevented from being attached to the substrate and thus from contaminating the substrate during the plasma processing. Accordingly, excellent etching may be stably performed.

After the predetermined etching finishes, the high frequency power is no longer supplied and the process gas is no longer introduced, and the substrate is transferred from the process chamber 10 in an order opposite to that described above.

Figure 7:
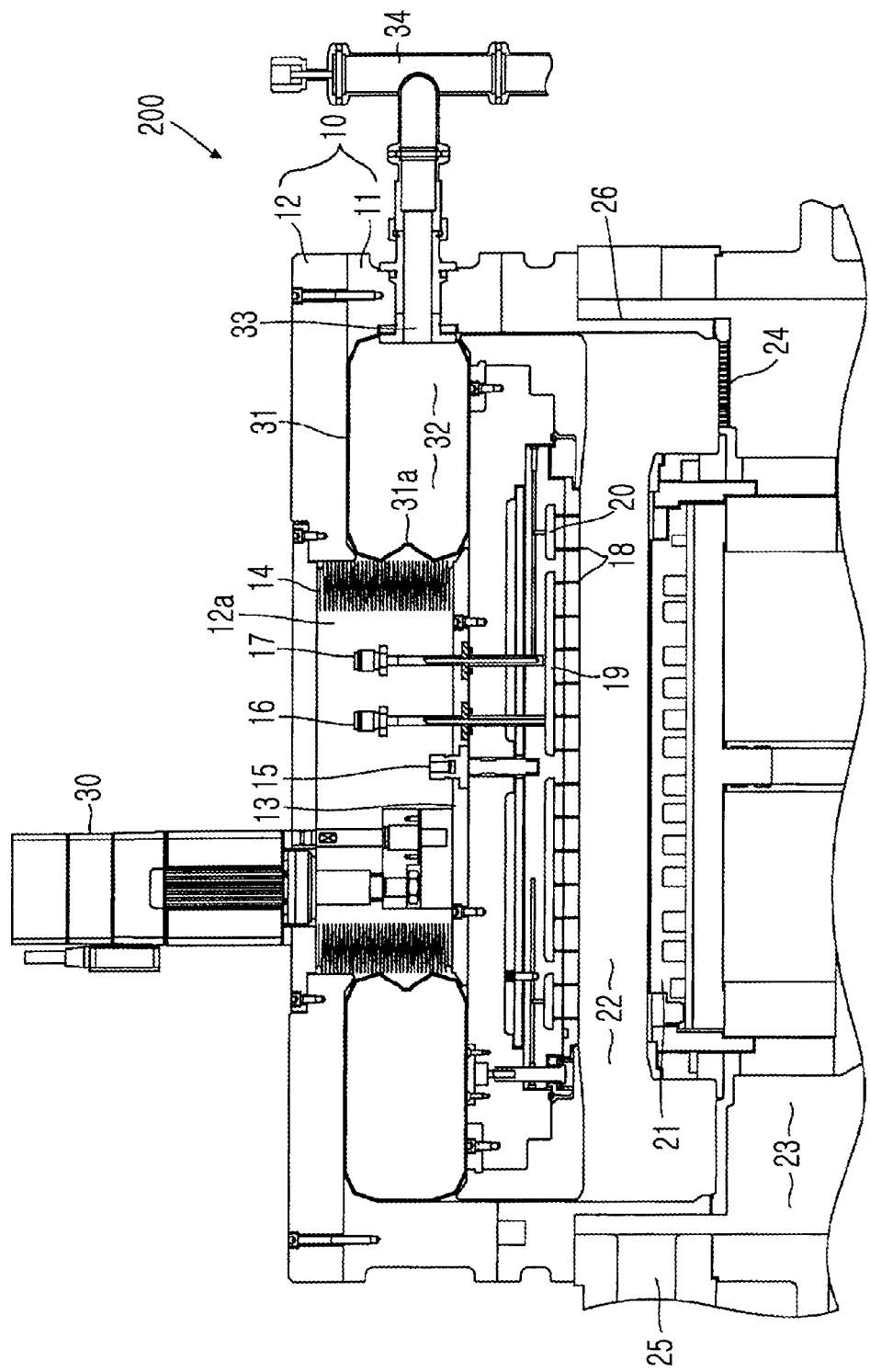
FIG. 7 is a longitudinal-sectional view showing a state where an upper electrode of the plasma processing apparatus of FIG. 5 is raised.
Figure 8:
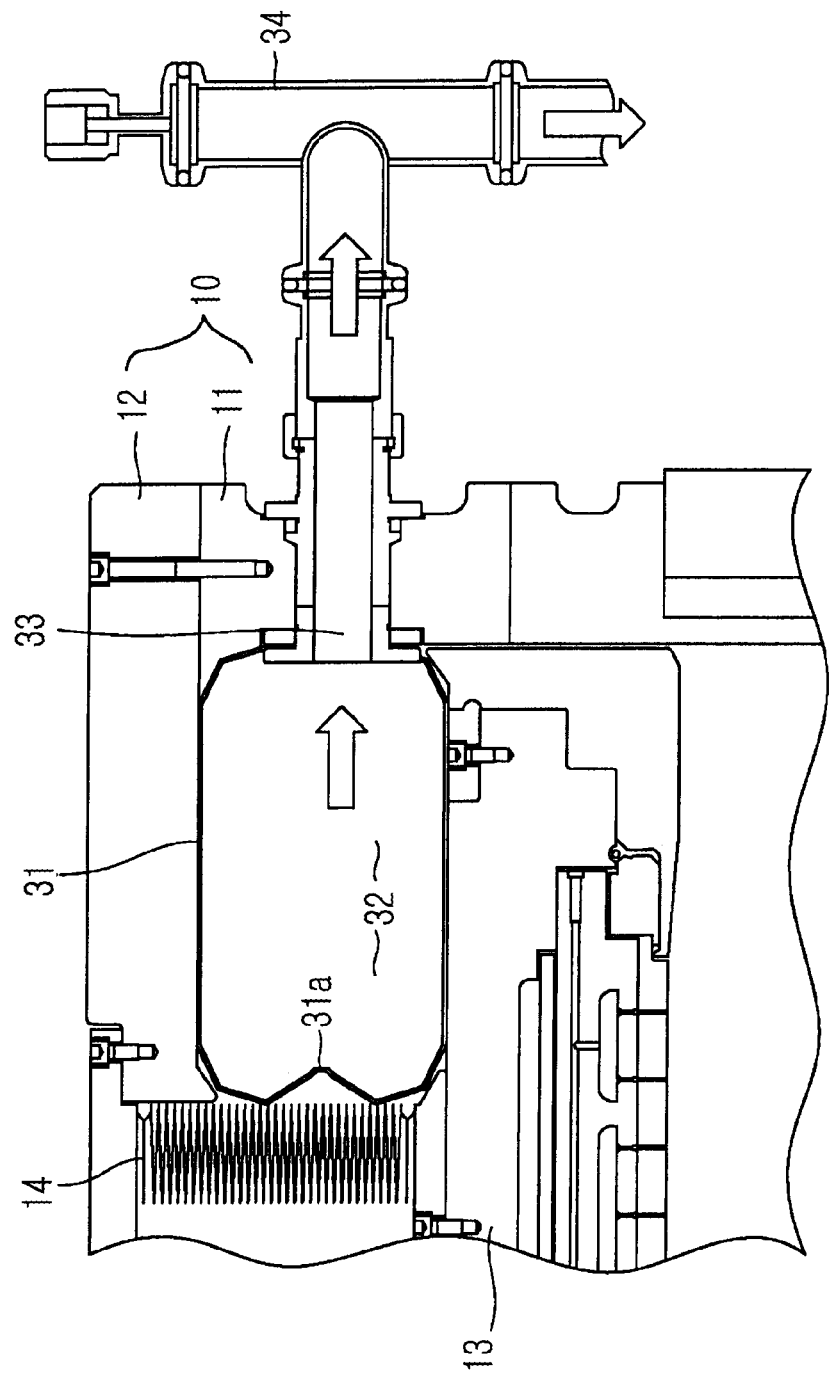
FIG. 8 is an enlarged longitudinal-sectional view showing essential parts of the plasma processing apparatus in the state of FIG. 7.

Next, a structure of a plasma etching apparatus 200 according to another embodiment of the present invention will be explained with reference to FIGS. 5 through 8. Also, FIGS. 7 and 8 show a state where the shower head 13 is raised as compared to a state of FIGS. 5 and 6, like in the previous embodiment of FIGS. 1 through 4.

In the plasma etching apparatus 200 of the present embodiment, the inlet/outlet 33 through which a gas is introduced into/exhausted from the isolated space is provided in a side surface of the isolated space providing member 31, and the gas introducing and exhausting mechanism 34 is connected to the inlet/outlet 33 with a side wall of the process chamber body 11 between the inlet/outlet 33 and the gas introducing and exhausting mechanism 34. As such, the inlet/outlet 33 of the isolated space providing member 31 may be provided in a side surface, instead of a top surface. Also, since other elements of the plasma etching apparatus 200 of the present embodiment are the same as those of the plasma etching apparatus 100 of the previous embodiment, the same elements are denoted by the same reference numerals and a repeated explanation thereof will not be given.

Also, the present invention is not limited to the above embodiments, and various modifications may be made. For example, although high frequency power having one frequency is supplied to a holding stage (lower electrode) in the above embodiments, the present invention may be applied to an apparatus which supplies a plurality of high frequency powers having different frequencies to the lower electrode.

The present invention may provide a plasma processing apparatus which is configured to change an interval between a shower head and a lower electrode by vertically moving the shower head so as to prevent a phenomenon such as abnormal discharge which may adversely affects plasma processing from occurring in a rear side space of the shower head and so as to stably perform excellent plasma processing.

What is claimed is:

1. A plasma processing apparatus comprising: a process chamber in which a substrate is received and plasma processing is performed;

a lower electrode which is provided in the process chamber and functions as a holding stage on which the substrate is placed;

an upper electrode which is provided in the process chamber to face the lower electrode, provides a process space between the upper electrode and the lower electrode, functions as a shower head for introducing a process gas to the substrate through a plurality of gas ejecting holes provided in a surface of the upper electrode facing the lower electrode, and is vertically movable to change an interval between the upper electrode and the lower electrode;

a cover body which is provided over the upper electrode and hermetically closes an upper opening of the process chamber;

a bellows which is adapted to be stretchable and retractable and is provided between the cover body and a top surface of the upper electrode;

an isolated space providing member which is disposed in an annular space surrounded by the upper electrode, the cover body, a side wall of the process chamber, and the bellows, has an isolated space therein and a folded portion, the isolated space being separated from the process chamber, and includes an inlet/outlet through which a gas is introduced into or exhausted from the isolated space so as to vary a volume of the isolated space, wherein the isolated space of the isolated space providing member substantially fills the annular space when a size of the annular space varies as the upper electrode is vertically moved;

a gas introducing and exhausting mechanism which introduces/exhausts the gas through the inlet/outlet into/from the isolated space of the isolated space providing member; and a high frequency power supply which generates plasma from the process gas by supplying high frequency power between the upper electrode and the lower electrode.

2. The plasma processing apparatus of claim 1, wherein the isolated space providing member has an annular shape.

3. The plasma processing apparatus of claim 1, wherein the isolated space providing member is formed of an elastomer.

4. The plasma processing apparatus of claim 3, wherein the isolated space providing member is formed of silicone rubber or fluorine rubber.

5. The plasma processing apparatus of claim 1, wherein the gas introducing and exhausting mechanism introduces an inert gas.

6. The plasma processing apparatus of claim 1, wherein the isolated space providing member is formed of an insulating material.

7. The plasma processing apparatus of claim 1, wherein the isolated space providing member is formed of a conductive material.

8. The plasma processing apparatus of claim 1, wherein the inlet/outlet is provided in a top surface of the isolated space providing member.

9. The plasma processing apparatus of claim 1, wherein the inlet/outlet is provided in a side wall of the isolated space providing member.

* * * * *